(12) United States Patent
Nishioka et al.

(10) Patent No.: US 9,368,320 B2
(45) Date of Patent: Jun. 14, 2016

(54) STAGE APPARATUS, AND CHARGED PARTICLE BEAM APPARATUS USING SAME

(71) Applicant: HITACHI HIGH-TECHNOLOGIES CORPORATION, Tokyo (JP)

(72) Inventors: Akira Nishioka, Tokyo (JP); Masaki Mizuochi, Tokyo (JP); Shuichi Nakagawa, Tokyo (JP); Hiroshi Tsuji, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/463,263

(22) Filed: Aug. 19, 2014

(65) Prior Publication Data

US 2015/0053857 A1    Feb. 26, 2015

(30) Foreign Application Priority Data

Aug. 26, 2013 (JP) ................. 2013-174073

(51) Int. Cl.
*H01J 37/20* (2006.01)
*H01J 37/28* (2006.01)
*H01J 37/18* (2006.01)

(52) U.S. Cl.
CPC ............... *H01J 37/20* (2013.01); *H01J 37/18* (2013.01); *H01J 37/28* (2013.01); *H01J 2237/2001* (2013.01); *H01J 2237/202* (2013.01); *H01J 2237/2002* (2013.01); *H01J 2237/20221* (2013.01); *H01J 2237/20278* (2013.01); *H01J 2237/2801* (2013.01)

(58) Field of Classification Search
USPC ............. 250/440.11, 441.11, 442.11, 443.1
See application file for complete search history.

(56) References Cited

U.S. PATENT DOCUMENTS

| 5,561,299 | A | * | 10/1996 | Ishida et al. | ............. 250/442.11 |
| 2003/0230729 | A1 | * | 12/2003 | Novak et al. | ............. 250/492.2 |
| 2010/0270476 | A1 | * | 10/2010 | Nishimaki | ............. G03F 7/707 250/442.11 |

FOREIGN PATENT DOCUMENTS

| JP | 2001-169529 A | 6/2001 |
| JP | 2002-353116 A | 12/2002 |

* cited by examiner

*Primary Examiner* — Nicole Ippolito
(74) *Attorney, Agent, or Firm* — McDermott Will & Emery LLP (57) ABSTRACT

The purpose of the present invention is to provide a stage apparatus that effectively suppresses the transmission of heat generated by a drive mechanism to a sample, and a charged particle beam apparatus using the same. In order to achieve the purpose, there are proposed a stage apparatus and a charged particle beam apparatus. The stage apparatus comprises a table; a drive source that drives the table in a predetermined direction; a first connection member provided between the table and the drive source; a second connection member provided between the table and the drive source and closer to the drive source than the first member; a slide unit supported by the second connection member; and a rail guiding the slide unit in a predetermined direction, the first connection member comprising a member having a relatively low heat conductivity with respect to the second connection member.

9 Claims, 9 Drawing Sheets

STAGE APPARATUS, AND CHARGED PARTICLE BEAM APPARATUS USING SAME

RELATED APPLICATIONS

This application claims the benefit of Japanese Application No. 2013-174073, filed on Aug. 26, 2013, the disclosure of which is incorporated by reference Herein.

BACKGROUND OF THE INVENTION

1. Technical Field

The present invention relates to a stage apparatus and a charged particle beam apparatus using the same, particularly to a stage apparatus and a charged particle beam apparatus suitable for suppressing the influence of heat generated when a stage is driven.

2. Background Art

As a result of the miniaturization of semiconductor elements that has been achieved in recent years, there is a demand for a corresponding increase in the accuracy of not only manufacturing apparatus but also examination and evaluation apparatus. Normally, the accuracy of geometries of a pattern formed on a semiconductor wafer is evaluated using a scanning electron microscope equipped with a length measurement function (hereafter referred to as "length measurement SEM"). In the length measurement SEM, the wafer is irradiated with an electron beam, and a resultant secondary electron signal is subjected to an image process to determine a pattern edge based on a change in image brightness, thus deriving dimensions.

Patent Document 1 discloses a transport apparatus using a linear motor. Patent Document 1 describes various techniques for decreasing the transfer of heat generated by the linear motor coil to a work holder member. For example, the work holder member is provided with cylindrical spacers for passing bolts where a component to be linked is attached, thus providing a space between the work holder member and the linked component. The component linked to the work holder member is provided with projections for decreasing the contact area. Further, a heat insulating sheet with small heat conductivity is disposed at a location in contact with the work holder member.

Patent Document 2 discloses, as an anti-heat measure in a charged particle drawing apparatus, a technique for promoting cooling by connecting a heat conduction promoting member, such as a copper tape or graphite sheet, between relatively moved stages.

RELATED ART DOCUMENTS

Patent Documents

Patent Document 1: JP 2001-169529 A
Patent Document 2: JP 2002-353116 A

SUMMARY OF THE INVENTION

A charged particle beam apparatus for high magnification ratio observation, such as a length measurement SEM, is required to be equipped with a stage apparatus capable of high accuracy positioning. Particularly, positioning accuracy for addressing the miniaturization of semiconductor elements is required. As a means of achieving such high accuracy positioning, a linear motor may be used in the stage apparatus drive mechanism. The linear motor can provide a mechanism enabling high speed and high accuracy positioning because of a small number of intervening components compared with a linear motion mechanism using a rotating motor and a ball screw. However, the coil and magnet as basic elements of the linear motor generate heat. Specifically, as current flows through the coil, Joule heat is produced by the electric resistance of the coil.

If the temperature of the wafer as a whole is increased by the generated heat, the wafer may become thermally expanded. The thermal expansion may cause the wafer to be extended as a whole, possibly resulting in the measurement object pattern being moved out of the field of view (FOV) of the length measurement SEM and the like during measurement by the SEM. Thus, the stage apparatus mounted in the charged particle beam apparatus, such as a length measurement SEM, is required to be capable of suppressing heat transfer to the sample. The sample stage capable of suppressing heat transfer to the sample is also desirable in processing and observation apparatus using a focused ion beam, or charged particle beam apparatus other than the electron beam drawing apparatus.

The technique for decreasing the amount of heat transmitted to the heat-sensitive object by interposing a heat resistance increasing configuration, as according to Patent Document 1, is effective in a system where the generated heat can escape to the surrounding air, such as in the atmosphere. However, the technique is not effective when the stage apparatus itself is placed in a high vacuum atmosphere where heat dissipation by the transfer of heat to the air cannot be expected, such as in the charged particle beam apparatus. Namely, in vacuum, even if the heat resistance is increased, there is nowhere the generated heat can escape. Indeed, the increase in heat resistance leads to a corresponding increase in temperature on the heat source side and, after all, the generated heat is transferred to components in contact with the heat source in accordance with the energy conservation law. Accordingly, the apparatus using a charged particle beam needs to be provided with an anti-heat measure for the vacuum environment.

Further, when the heat transfer is promoted by connecting the moving stages via a sheet-like member as described in Patent Document 2, the sheet-like member needs to have a length greater than the stroke of the relative movement of the stages.

When heat is transferred by heat conduction in the sheet-like member, the created heat resistance is proportional to the length of the sheet-like member, and inversely proportional to the cross sectional area of the sheet-like member. Namely, the amount of heat that the sheet-like member can transfer is expressed by the following:

$$Q = \lambda \cdot A \cdot \Delta T / L$$

where Q is the transported amount of heat [W], $\lambda$ is the heat conductivity of the sheet-like member [W/(m·K)], A is the cross sectional area of the sheet-like member [m$^2$], $\Delta T$ is the temperature difference between the ends of the sheet-like member [K], and L is the length of the sheet-like member [m].

Thus, across the ends of the sheet-like member, a temperature difference expressed by the following is produced:

$$\Delta T = Q \cdot L / (\lambda \cdot A)$$

As described above, the sheet-like member needs to have a length greater than the stroke of the relative movement of the stages, and the cross sectional area of the sheet-like member needs to be decreased to such an extent that the flexibility of the sheet-like member can be maintained. Because of these restrictions, such a cooling promoting system cannot eliminate the development of a certain temperature increase on the heat source side. Namely, this technique still results in a certain temperature increase on the side where the linear motor coil is used.

In the following, a stage apparatus with the purpose of effectively suppressing the transmission of heat generated in a drive mechanism to a sample, and a charged particle beam apparatus using the same will be described.

According to an embodiment for achieving the purpose, there are proposed a stage apparatus and a charged particle beam apparatus provided with the stage apparatus. The stage apparatus comprises a table on which a sample is placed; a drive source configured to drive the table in a predetermined direction; a first connection member disposed between the table and the drive source; a second connection member disposed between the table and the drive source and closer to the drive source than the first member; a slide unit supported by the second connection member or by a supported member supported by the second connection member; and a rail guiding the slide unit in the predetermined direction. The first connection member comprises a relatively low heat conductivity member with respect to the second connection member, According to the above configuration, the transmission of heat generated in the drive mechanism to the sample can be effectively suppressed, whereby highly accurate positioning can be achieved.

DETAILED DESCRIPTION OF THE PREFERRED EMBODIMENTS

In the following, a concrete configuration of a stage mechanism used mainly in a charged particle beam apparatus will be described. In the apparatus using a charged particle beam, the position of a sample placed in vacuum needs to be highly accurately moved. Thus, when the sample is moved by a stage apparatus using a linear motor drive mechanism, it is desired to prevent thermal deformation of the sample due to a temperature change caused by the transfer of heat from the coil, lest the local position of the sample be changed by the heating of the linear motor coil.

In order to block the transfer of heat generated by the linear motor coil to the sample stage carrying and holding a wafer, the magnet may be provided on the side moved with the sample stage, while the coil may be affixed on the side separated from the sample stage. In this case, while the transfer of heat from the coil may be prevented, the magnet would be moved with the sample stage. As a result, a large magnetic field change would be caused, facilitating the generation of noise and preventing an increase in accuracy.

Thus, according to the present embodiment, in an apparatus in which an object item (sample) disposed in vacuum, for example, is irradiated with a charged particle beam, and in which the position of the object item irradiated with charged particles is changed by moving a stage on which the object item is affixed, the stage apparatus is configured such that, in the case of a structure where a slide unit is affixed to a table holding the object item and moved in contact with (while being guided by) a rail, and where a heat generating body, such as a linear motor coil (drive source) is connected to the table, at least two components are interposed between the heat generating body and the table where they are connected. One of the components that is in contact with the heat generating body comprises a material with a relatively high heat conductivity (second connection member). The component in contact with the table (first connection member) comprises a material with a relative low heat conductivity. The component in contact with the heat generating body is placed in contact with a slide unit that is not in contact with the table, the slide unit being moved in contact with a rail.

The two components may not need to be each in contact with the table or the heat generating body directly. For example, the two components and the table and the heat generating body may be connected via supported members supported by the two components. However, the supported member provided on the table side comprises a member having a low heat conductivity, while the supported member provided on the heat generating body side comprises a member having a high heat conductivity.

According to the above configuration, the heat generated by the heat generating body, such as the linear motor coil, flows to the material contacting the heat generating body and having a relatively high heat conductivity, and then flows to the subsequent slide unit. The slide unit is in contact with the rail, so that the heat from the heat generating body flows to the rail, and the heat that has flowed to the rail flows to a substance affixing the rail. As a result, the heat transmitted to the table to which the heat generating body is connected via the interposed components is decreased. Thus, the temperature increase in the table holding the object item that is irradiated with the charged particle beam can be suppressed, thus preventing the thermal deformation of the object item and enabling highly accurate measurement and processing.

In the following, embodiments will be described with reference to the drawings.

Embodiment 1

Figure 1:
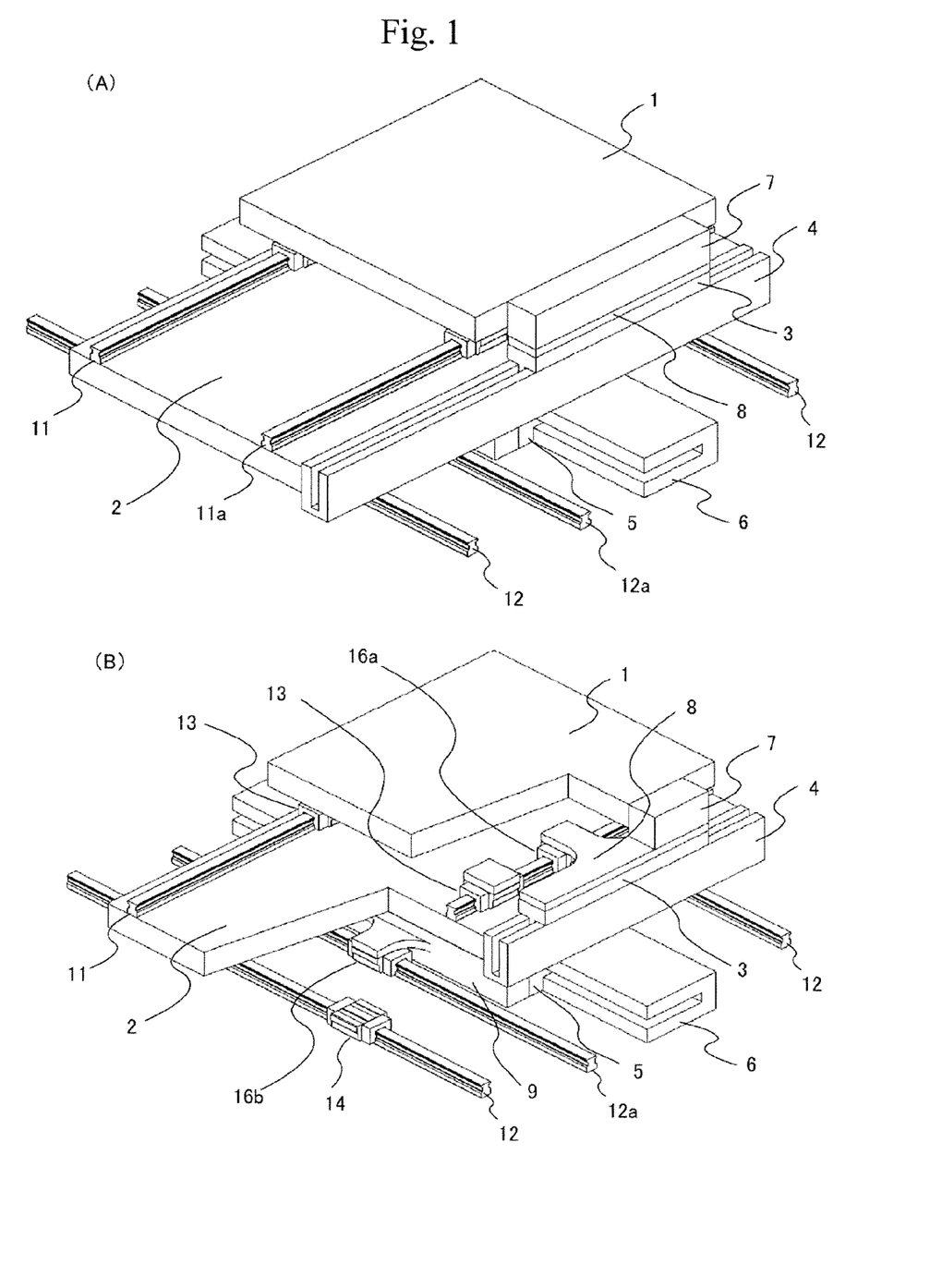
FIGS. 1(A) and 1(B) are configuration diagrams of a stage apparatus used in a charged particle beam apparatus (embodiment 1).

FIG. 1(A) illustrates the configuration of a stage apparatus used in a charged particle beam apparatus according to a first embodiment. FIG. 1(B) is a cutaway view of the same stage apparatus of FIG. 1(A), illustrating the internal structure of the apparatus in an easily understandable manner. The apparatus of FIGS. 1(A) and (B) are identical. The stage apparatus illustrated in FIG. 1 is disposed in a vacuum chamber of the charged particle beam apparatus, and controlled by a control device which is not shown. In the vacuum chamber, a beam column including an electron source, a focusing lens, a scan deflector, an objective lens, a detector and the like is disposed. A desired location of a sample positioned by the stage apparatus is irradiated with a beam to perform a measurement, an examination, an observation, or a processing and the like.

Figure 2:
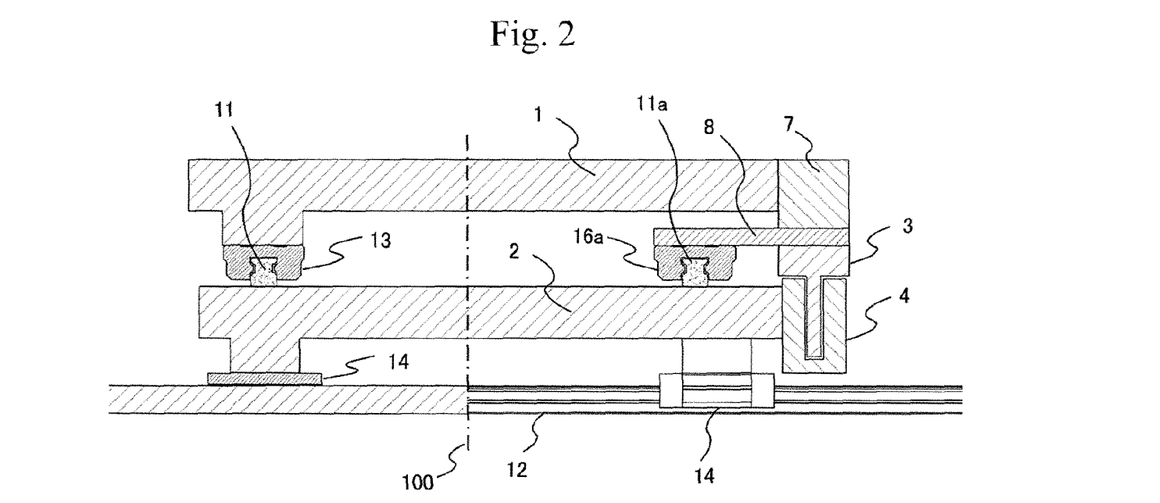
FIG. 2 is a cross sectional view of an anti-heat structure for an upper-level table of a stage apparatus used in the charged particle beam apparatus (embodiment 1).
Figure 3:
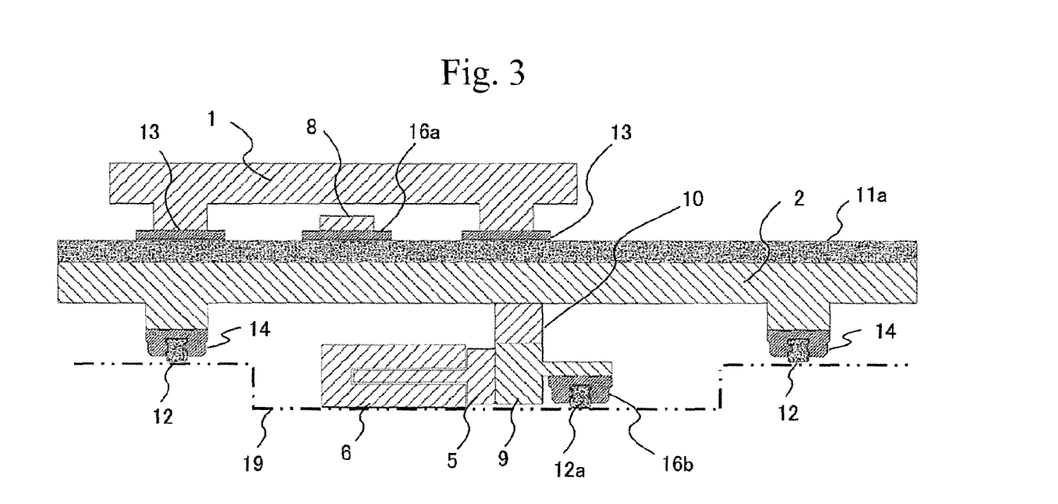
FIG. 3 is a cross sectional view of an anti-heat measure structure for a lower-level table of the stage apparatus used in the charged particle beam apparatus (embodiment 1).

FIG. 2 is a cross sectional view of the stage apparatus of FIG. 1, as viewed from the lower left toward the upper right of FIG. 1. The position of cross section is varied at the position indicated by a chain line 100. To the right of the chain line 100 is a cross section taken across a heat-bypassing slide unit 16a. To the left of the chain line 100 is a cross section taken across a moving slide unit 13 which is located at each of the four corners. FIG. 3 is also a cross sectional view of the stage apparatus of FIG. 1 as viewed from the upper left toward lower right of FIG. 1.

In the following, the first embodiment will be described with reference to FIGS. 1 to 3. The sample, such as a wafer, that is irradiated with the charged particle beam is held by a component (not shown) that belongs to an upper-level table 1. The upper-level table 1 and a lower-level table 2 are provided to move the table 1 in the bi-axial directions of X and Y, with the respectively associated mechanisms responsible for movements in the X-axis and the Y-axis. To the table 1, the moving slide units 13 are connected at the four corners. The respective slide units are moved in contact with rails 11 and 11a, thus enabling movement only along the direction of the rails and restricting the table position so that its movement in any other directions is disabled. The rails 11 and 11a are affixed to the lower-level table 2. To the lower-level table 2, moving slide units 14 are connected at the four corners. The slide units 14 are moved in contact with rails 12. The rails 12 are affixed to a base 19 (not shown).

The lower-level table 2 is driven by a linear motor comprising a coil 5 and a magnet 6. The magnet 6 is affixed to the base. As the coil 5 is moved relative to the affixed magnet 6, the lower-level table 2 is moved relative to the base. The upper-level table 1 is driven by a linear motor comprising a coil 3 and a magnet 4. The magnet 4 is affixed to the lower-level table 2. As the coil 3 is moved relative to the magnet 4, the upper-level table 1 is moved relative to the lower-level table 2. Based on a combination of the movement of the upper-level table and the movement of the lower-level table, the sample can be moved to arbitrary coordinates of the two axes of X and Y.

In the above X-Y stage using a basic linear motor, the heat generated by the linear motor coil is transmitted to the tables and, as a result, thermal deformation of the sample may be caused. Thus, according to the first embodiment, two means against heat are employed. As a first means, as illustrated in FIG. 2, components 8 and 7 are interposed between the coil 3 and the table 1. The component 8 is a component that provides a bypass for the heat generated by the coil 3. The component 8, being in contact with the coil 3, receives the heat from the coil 3 and, being in contact with a heat-bypassing slide unit 16a, enables the flow of the heat to a bypass route. In order to ensure that the coil 3 and the table 1 be structures that are moved integrally, the connecting component 7 is connected to both the table 1 and the heat-bypass component 8. In this case, in order to decrease the heat transmitted to the table 1 via the connecting component 7, the material for the connecting component 7 is selected such that its heat conductivity is lower than that of the material for the heat-bypass component 8. For example, resin may be used for the connecting component 7, and aluminum may be used for the heat-bypass component 8. These components may be connected using bolts and the like, which are not shown.

Because resins have lower heat conductivity than metals, it is advantageous to use resin for the connecting component 7. In addition, resins have smaller density than metals, so that a resin contributes to a decrease in the mass of the components driven by the linear motor, thus providing the effect that the load to the linear motor can be reduced and the heating of the coil 3 can be lessened. It would also be effective to use a ceramics material for the connecting component 7 in order to decrease the transmitted amount of heat.

The amount of heat corresponding to the decrease, through the creation of the heat-bypass route, in the amount of heat transmitted to the table 1 is dissipated as it is transmitted from the heat-bypass component 8 to the slide unit 16a, to the rail 11a in contact therewith, to the lower-level table 2 therefrom, to the slide units 14 therefrom, to the rails 12 in contact therewith, and eventually to the base affixing the rails 12. Namely, by creating the route for transmitting the amount of heat generated by the coil 3 eventually to the base via the solidly contacted components instead of to the table 1, the amount of heat transmitted to the table 1 can be decreased, enabling a suppression of the temperature increase of the table 1. Thus, the heat-bypassing slide unit 16a, although in contact with the rail 11a shared with the moving slide units 13, contributes to a decrease in the amount of heat transmitted to the table 1 by being not in contact with the table 1.

As a second anti-heat means according to first embodiment, as illustrated in FIG. 3, a heat-bypass component 9 and a table connecting component 10 are interposed between the coil 5 and the table 2. As in the first anti-heat means, the heat-bypass component 9, by being in contact with the coil 5, receives the heat generated by the coil 5 and, by being in contact with a heat-bypassing slide unit 16b, enables a flow of the heat to a bypass route. In order to ensure that the coil 5 and the table 2 be structures that are moved integrally, the connecting component 10 is connected to both the table 2 and the heat-bypass component 9. The material used for the connecting component 10 is selected such that its heat conductivity is lower than that of the material for the heat-bypass component 9, thus decreasing the amount of heat transmitted to the table 2. Resin may be used for the connecting component 10, and aluminum may be used for the heat-bypass component 9. These components may be connected using bolts and the like, which are not shown.

In the case of the first anti-heat means, the rail that the heat-bypassing slide unit contacts is common with the rail that the moving slide units contact. The second anti-heat measure differs in that the heat-bypassing slide unit contacts a dedicated heat-bypass rail 12a. However, in both of the two measures against heat, the constituent elements are connected in the order of the coil as the heat source (drive source), the heat-bypass member as the slide unit support member (second connection member), and the table connection member (first connection member), and the table.

The above difference depends on whether the linear motor is disposed at the center or towards the edge with respect to the table. The magnet 4 of the linear motor for driving the upper-level table 1 is affixed to the lower-level table 2, and thus the magnet 4 is moved along with the table 2. As a result, a magnetic field variation is produced. Thus, in order to decrease the influence of the magnetic field variation on the charged particle beam, the magnet is disposed at the edge of the table which is far from the sample rather than at the table center which is closer to the sample. As the linear motor is distanced from the center of the table 1, the distance between the linear motor and the rail becomes smaller. This makes it possible for the rail 11a to provide both the rail function for the moving slide unit and the heat-bypassing function when the heat-bypass route is formed. In this way, a low-cost anti-heat structure is realized.

Because the magnet 6 of the linear motor for driving the lower-level table 2 is affixed to the base and not moved, no magnetic field variation is caused. Thus, the linear motor is disposed at the center of the table so that the propulsion force of the linear motor can be transmitted near the center of gravity of the driven object, thus decreasing the moment generated by a displacement between the center of gravity and the line of action of the driving force. As a means for decreasing the moment, additional two linear motors may be provided, and each of the linear motors may be attached outside the two rails 12. However, a cost reduction can be achieved when the linear motor is disposed at the center, which would require only one linear motor.

Because a distance from the rails 12 utilized by the moving slide units 14 at the four corners is required, the dedicated heat-bypassing rail 12a is provided. Thus, the distance over which the heat-bypass component 9 needs to transport heat is decreased. As a result, the heat transfer resistance is reduced and the amount of heat that flows through the heat-bypass route is increased, thus enabling a decrease in the heat transmitted to the table 2. The decrease in the amount of heat transmitted to the table 2 reduces the temperature increase in the table 2, which in turn reduces the temperature increases in the rails 11 and 11a in contact with the table 2, the slide units 13 in contact with the rails 11 and 11a, and further the table 1, thus contributing to a decrease in the temperature increase in the sample.

According to the present embodiment, the heat generated by the coil 5 is caused to escape by a configuration transmitting the heat to the dedicated rail 12a. It is also possible, however, to adopt a structure such that, for cost reduction, the heat is caused to escape to the rails 12 shared with the moving slide units 14.

According to the present embodiment, while components underneath the base are not shown, the base component provides a container for creating a vacuum environment in the stage apparatus. By adopting a structure such that the heat can escape to the outside of the vacuum container, heat dissipation can be achieved by transmitting the heat from the stage apparatus to the base. The means for heat dissipation beyond the base may include a method where cooling water is directly circulated inside the base component; a method where a component in which cooling water is circulated is placed in contact with the outside of the vacuum container; and an air-cooling means including heat dissipation fins.

Figure 4:
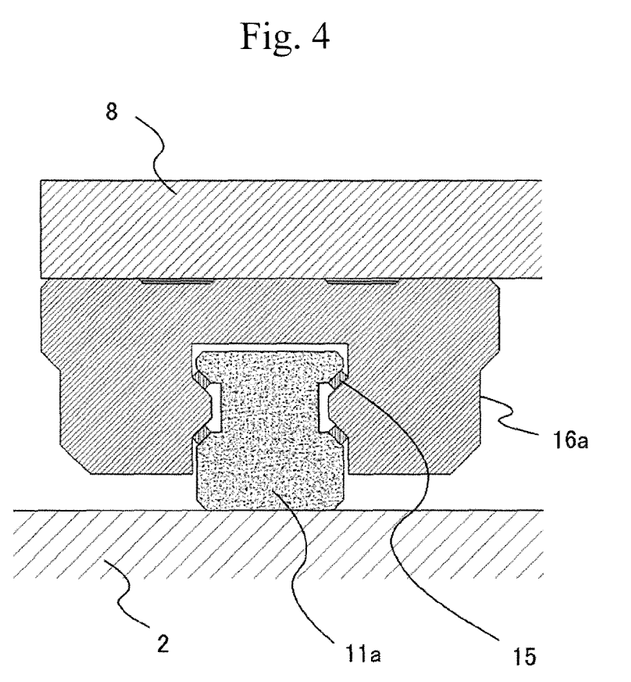
FIG. 4 is a simplified cross sectional view of a slide unit used in the stage apparatus.

FIG. 4 illustrates a simplified cross section of the heat-bypassing slide unit used in the present embodiment. An upper surface of the slide unit 16a is placed in contact with the heat-bypass component 8 and the two are affixed by bolts and the like which are not shown, thus enabling the transmission of heat from the heat-bypass component 8 to the slide unit 16a. Further, a lower surface of the rail 11a is placed in contact with the table 2 and the two are affixed by means of bolts and the like which are not shown, enabling the transmission of heat from the rail 11a to the table 2. For the transfer of heat between the slide unit 16a and the rail 11a, it is effective to use heat transfer between solids contacting each other. However, an increase in frictional force during their movement leads to an increase in the linear motor load and the amount of heat generated by the coil. Thus, the frictional force should be minimized. Accordingly, in the slide unit 16a, there is provided a structure, not shown, allowing for rotation of rolling elements 15, the rolling elements 15 rotating while solidly contacting both the rail and the slide unit, thus transmitting heat by heat transfer through the solids.

By adopting the rolling contact, frictional force is decreased compared with sliding contact. For the rolling elements 15, a method involving the use of spherical balls and a method involving the use of cylindrical rollers are available. When balls are used, the advantage of small frictional force can be obtained. When rollers are used, the advantage of improved heat transfer performance due to greater contact area can be obtained. It would also be effective to use lubricating oil for decreasing the resistance during the rotation of the rolling elements 15 inside the slide unit 16a, whereby the advantage of improved heat transfer performance can be obtained.

Because the stage apparatus is used in a high vacuum environment, non-volatile (=low saturation vapor pressure) lubricating oil is selected for lubricating the rolling elements. By forming the contact surfaces of the rail 11a contacting the rolling elements 15 at an angle of 45°, positional displacement in the vertical direction and the horizontal direction in the drawing can be simultaneously prevented, while enabling the vertically applied gravity to be received by the inclined surfaces. In this way, the surface pressure and the contact area can be increased, whereby heat transfer performance can be improved.

Components related to the rolling elements 15 may be designed with dimensions such that a certain amount of elastic deformation is caused in the rolling elements 15 even when no weight is placed thereon. In this way, the heat transfer performance can be improved by an increase in contact area. Namely, a complete sphere and a planar surface would only produce a point contact, and a complete cylinder and a planar surface would also only produce a linear contact. Thus, a design that does not permit elastic deformation would produce only a very little contact area even considering the surface roughness.

On the other hand, a design that permits elastic deformation can significantly increase the contact area whether the rolling elements comprise balls or rollers. In order to increase the position accuracy of the table, it is preferable to select a material for the moving slide units with a high Young's modulus so that the slide units are not elastically deformed. For the heat-bypassing slide unit, however, it is also effective to select a material with high heat conductivity without taking the Young's modulus into consideration because the heat-bypassing slide unit is not responsible for position accuracy. The dimension of the heat-bypassing slide unit in the depth direction of FIG. 4 may be made greater than the length of the moving slide unit, whereby heat transfer performance can be improved.

Embodiment 2

Figure 5:
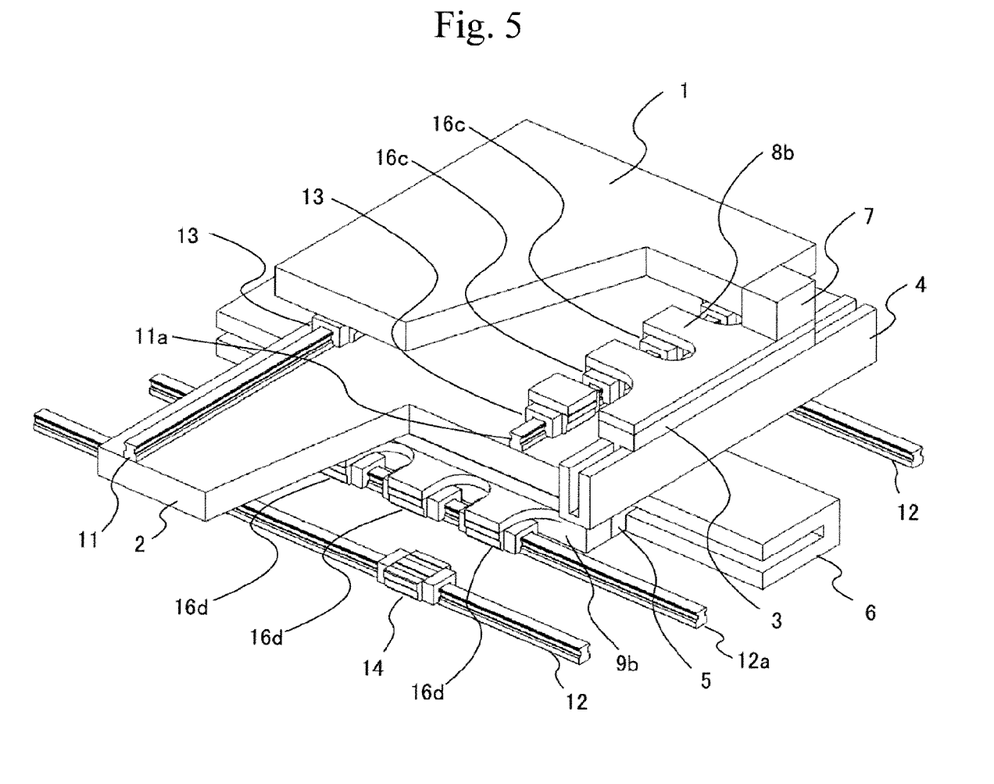
FIG. 5 is a configuration diagram of a stage apparatus used in the charged particle beam apparatus (embodiment 2).

FIG. 5 illustrates the configuration of the stage apparatus used in the charged particle beam apparatus according to a second embodiment. Components with functions similar to those of the first embodiment are designated with similar reference signs and their description will be omitted. FIG. 5 is a cutaway view similar to FIG. 1(B) except that the hidden lines are not shown.

In order to decrease the heat transmitted to the upper-level table 1 even more, two heat-bypassing slide units 16c are used, thus compensating for the heat resistance to the transmission of heat from the slide units to the rail, and increasing the amount of heat transmitted via the heat-bypass route. Because the linear motor coil 3 is longitudinal in the direction of movement, when the heat is transmitted by a heat-bypass component 8b, heat resistance corresponding to the distance in the longitudinal direction is produced. However, by using a plurality of the heat-bypassing slide units, the distance for transmission of heat by the heat-bypass component 8b is decreased, whereby heat transfer performance can be improved. While, according to the present embodiment, two heat-bypassing slide units 16c are used, the number of the heat-bypassing slide units may be increased to three or more.

Similarly, in order to decrease the heat transmitted to the lower-level table 2 even more, three heat-bypassing slide units 16d are connected to a heat-bypass component 9b, thus compensating for the heat resistance to the transmission of heat from the slide units to the rail. Because the lower-level linear motor needs to move the mass of both the lower-level table and the upper-level table, the load to the lower-level linear motor is generally greater than that on the upper-level side. Thus, the amount of heat generated by the lower-level coil 5 is greater than the heat generated by the upper-level coil 3. Accordingly, in the design of the heat-bypass route, it is more effective to reinforce the lower-side, and increasing the number of the heat-bypassing slide units for the lower side is efficient from the viewpoint of cost-effectiveness. Increasing the number of the slide units leads to a slight increase in frictional force, resulting in a corresponding increase in the heat generated by the coil. In the case of the upper-level heat bypass, even if the bypass route is reinforced so as to decrease the heat directly transmitted to the table 1, there is the route via which the heat transmitted to the table 2 via the bypass route is transmitted to the table 1 through the rails 11 and 11a and the moving slide units 13. Thus, the upper-level heat bypass should be designed while sufficiently evaluating the quantitative effect. On the other hand, in the case of the lower-level heat-bypass route, the amount of heat transmitted to the table 2 can be decreased by increasing the number of the heat-bypassing slide units 16d as long as the effect obtained by reinforcing the heat transfer capacity is more than the increase in the amount of generated heat.

Embodiment 3

Figure 6:
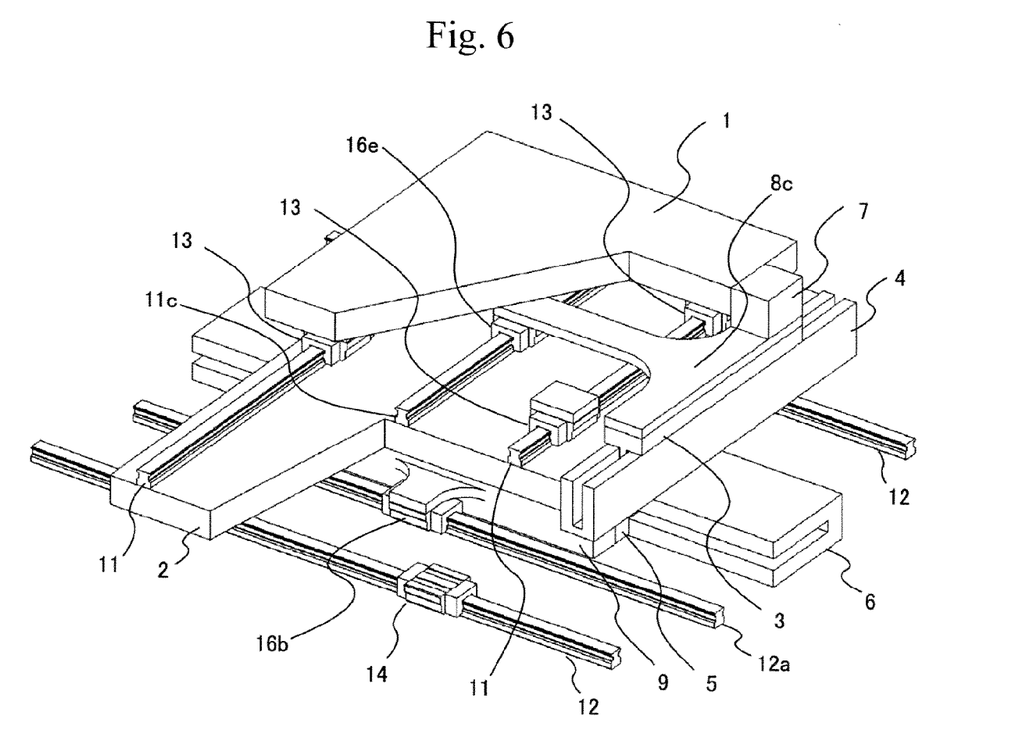
FIG. 6 is a configuration diagram of a stage apparatus used in the charged particle beam apparatus (embodiment 3).

FIG. 6 illustrates the configuration of the stage apparatus used in the charged particle beam apparatus according to a third embodiment. As in foregoing, components with functions similar to those of the first embodiment are designated with similar reference signs and their description will be omitted. FIG. 6 is also a cutaway view similar to FIG. 5.

The third embodiment differs from the first embodiment in that the heat from the upper-level linear motor escapes via a heat-bypass route to a dedicated rail 11c. In embodiment 1, the heat generated by the coil 3 is transmitted to one side of the table 2, resulting in an uneven, although slightly, temperature distribution in the table 2. This is addressed by the structure of the third embodiment, where the rail 11c is disposed at the center of the table 2, and a heat-bypass component 8c is connected to a heat-bypassing slide unit 16e connected to the rail, so that the heat generated by the coil 3 can be transmitted to the center of the table 2. Thus, the table 2 has a left-right symmetrical temperature distribution, preventing the thermal deformation of the table 2 due to a temperature difference between the left and right sides. Although it might be difficult to see in the perspective view, the heat-bypass component 8c is only in contact with the slide unit 16e, the connecting component 7, and the coil 3, and not with the table 1. In this way, the transfer of heat to the table 1 is prevented.

Embodiment 4

Figure 7:
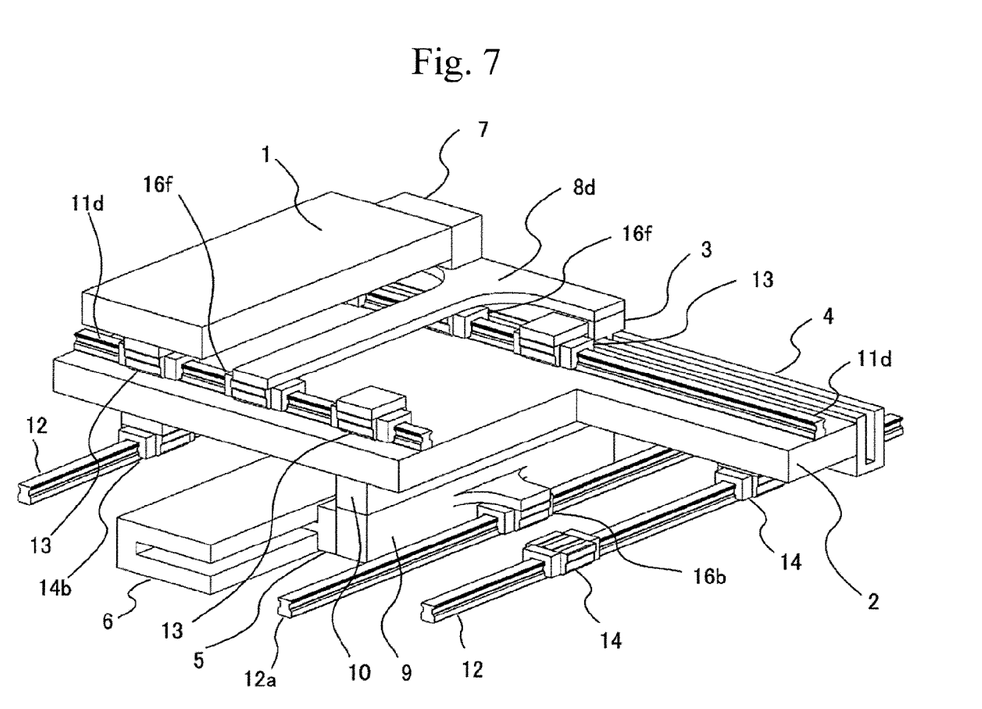
FIG. 7 is a configuration diagram of a stage apparatus used in the charged particle beam apparatus (embodiment 4).

FIG. 7 illustrates the configuration of the stage apparatus used in the charged particle beam apparatus according to a fourth embodiment. FIG. 7 is also a cutaway view, although at a slightly different angle from FIGS. 5 and 6 but with the same basic configuration.

The fourth embodiment differs from the first embodiment in that the heat generated by the upper-level linear motor escapes via a heat-bypass route to two rails 11d. Thus, according to the fourth embodiment, two heat-bypassing slide units 16f are used, with a heat-bypass component 8d contacting both of the heat-bypassing slide units. As in the third embodiment, the transfer of heat to the table 1 is prevented by the heat-bypass component 8d not contacting the table 1. Further, as in the problem addressed by the third embodiment, the heat is transmitted to the two rails 11d so that the table 2 has a left-right symmetrical temperature distribution. Because more heat can be transmitted to the heat-bypassing slide units 16f closer to the coil 3, there may be adopted a design such that a uniform amount of heat between the left and right sides can be transmitted by slightly decreasing the area of contact between the component 8d and the slide unit closer to the coil 3.

Embodiment 5

Figure 8:
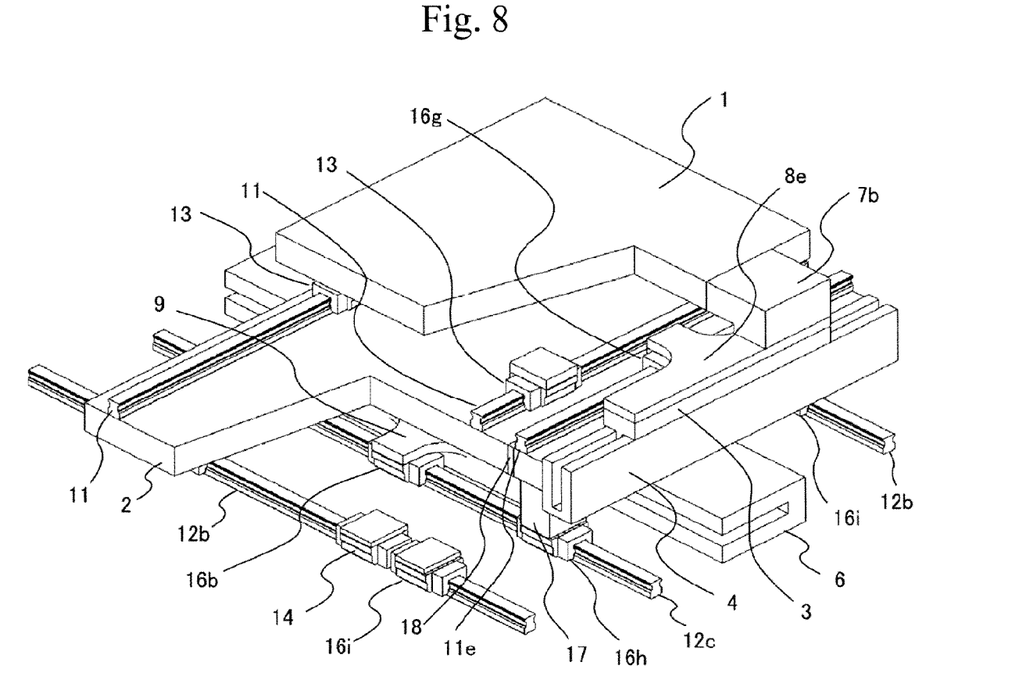
FIG. 8 is a configuration diagram of a stage apparatus used in the charged particle beam apparatus (embodiment 5).
Figure 9:
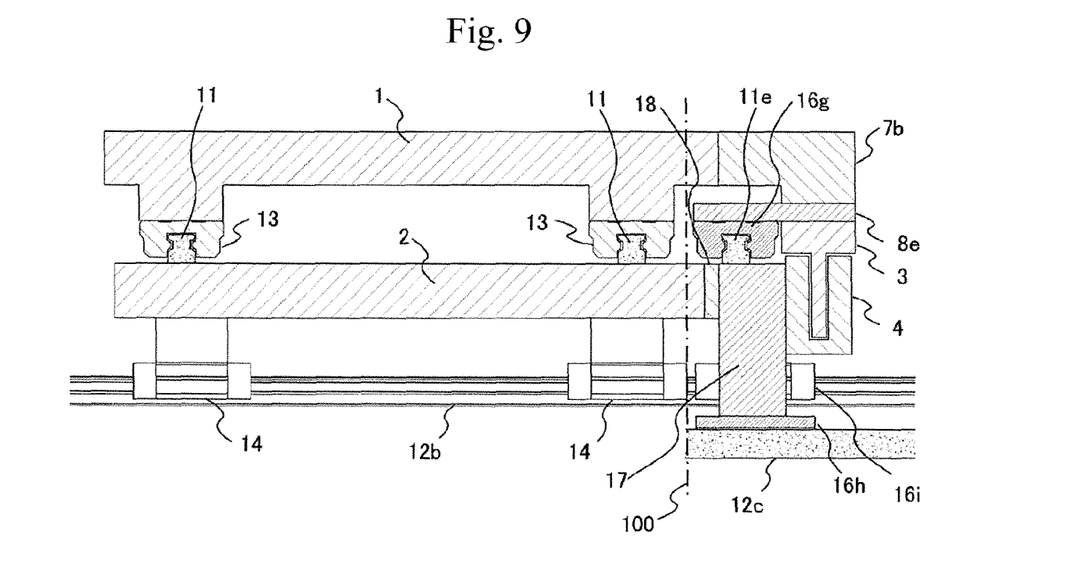
FIG. 9 is a cross sectional view of an anti-heat measure structure for the upper-level table of the stage apparatus used in the charged particle beam apparatus (embodiment 5).

FIGS. 8 and 9 illustrate the configuration of the stage apparatus used in the charged particle beam apparatus according to a fifth embodiment. FIG. 8 is also a cutaway view similar to FIGS. 5 and 6, while FIG. 9 is a cross sectional view based on the same display method as in FIG. 2. To the right of the chain line 100 in FIG. 9 is shown a cross section taken across both a slide unit 16g and a slide unit 16h. To the left of the chain line 100 is shown a cross section taken across the slide units 13.

According to the fifth embodiment, the upper-level heat-bypass route is formed with a structure such that the transfer of heat to the lower-level table 2 is decreased while the heat can be transmitted directly toward the base. Namely, the heat generated by the coil 3 is transmitted to a heat-bypass component 8e and further to a dedicated heat-bypass rail 11e via a heat-bypassing slide unit 16g. The rail 11e is in contact with a heat-bypass component 17 which is level with the lower-level table and yet thermally insulated from the table 2. Although the heat-bypass component 17 is moved integrally with the table 2, the transfer of heat to the table 2 is prevented by an interposed connecting component 18 comprising a low heat conductivity material. Although not shown in the cutaway view, the heat-bypass component 17 has the same length as the table 2, with a heat-bypassing slide unit connected underneath, and is connected to a slide unit 16i to the fore, to a slide unit 16i in the rear, and to a slide unit 16h at the center of FIG. 8. The slide units 16i are in contact with rails 12b shared with the moving slide units 14, while the slide unit 16h is in contact with a rail 12c shared with the lower-level heat-bypassing slide unit 16b. Because the rails 12b and 12c are each affixed to the base, there is formed a route such that the heat generated by the coil 3 is transmitted to the base and not to the lower-level table 2. Thus, the temperature increase in the table 2 can be suppressed, whereby the temperature increase in the upper table 1 is also suppressed.

Embodiment 6

Figure 10:
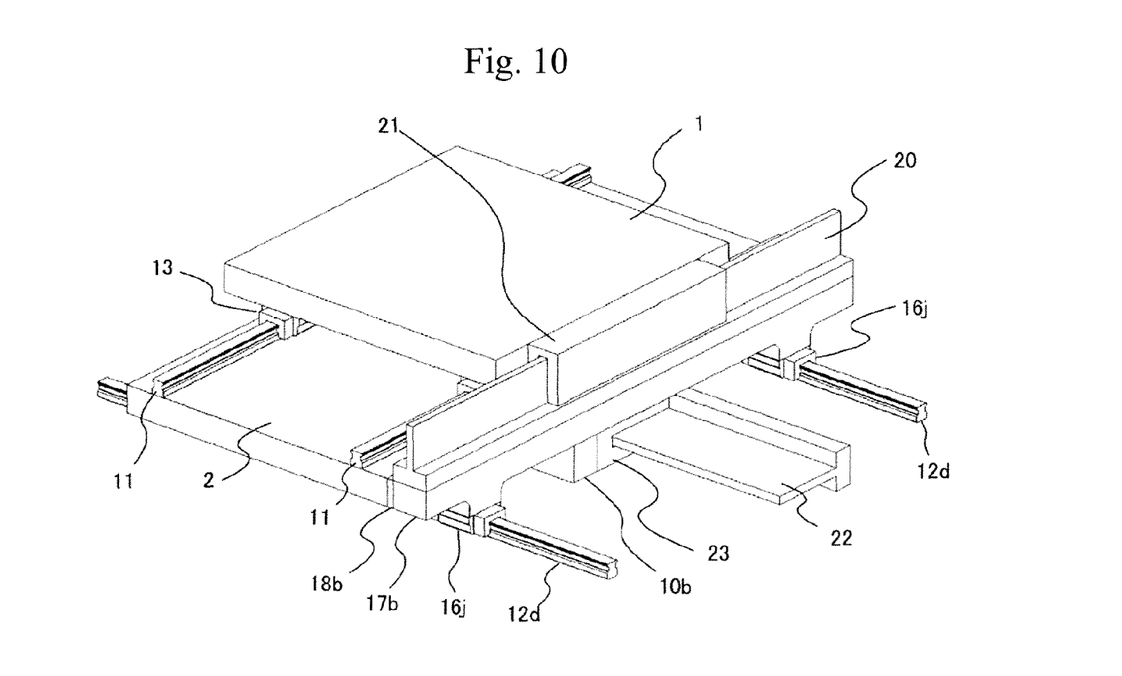
FIG. 10 is a configuration diagram of a stage apparatus used in the charged particle beam apparatus (embodiment 6).
Figure 11:
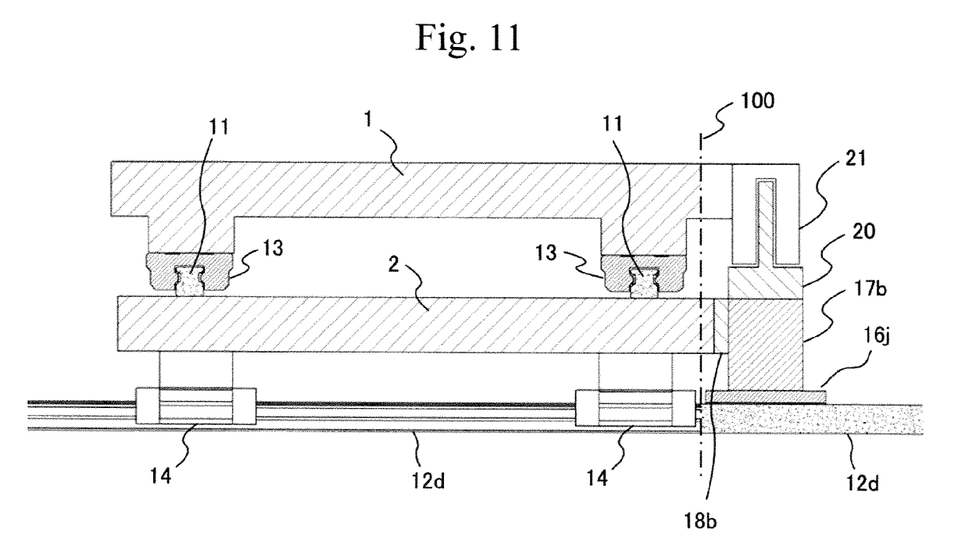
FIG. 11 is a cross sectional view of an anti-heat measure structure for the lower-level table of the stage apparatus used in the charged particle beam apparatus (embodiment 6).

FIGS. 10 and 11 illustrate the configuration of the stage apparatus used in the charged particle beam apparatus according to a sixth embodiment. FIG. 10 is an overall perspective view based on the same display method as in FIG. 1(A). FIG. 11 is a cross sectional view based on the same display method as in FIG. 9. To the right of the chain line 100 in FIG. 11 is shown a cross section taken across a slide unit 16j. To the left of the chain line 100 is shown a cross section taken across the slide units 13.

While the moving coil type linear motors are used in all of embodiments 1 to 5, moving magnet type linear motors are used for both the upper-level table and the lower-level table according to embodiment 6. In the present embodiment, it is also possible to selectively use both the moving coil type linear motor and the moving magnet type linear motor for the upper-level side and the lower-level side as needed.

When the moving magnet type linear motor is used for driving the upper-level table 1, a magnet 21 is affixed to the upper-level table 1, and a coil 20 is affixed to the lower-level table 2. When the moving magnet type linear motor is also used for the lower-level table, a magnet 23 is affixed to the lower-level table 2, and a coil 22 is affixed to the base. Thus, the coil 22 is not connected to the table, so that the problem of temperature increase due to the heat from the coil 22 can be solved. However, because the coil 20 is connected to the lower-level table, an anti-heat measure is required. Thus, when the coil 20 is connected to the lower-level table 2, a component 17b and a component 18b are interposed, with the component 17b connected to heat-bypassing slide units 16j so that the heat can be transmitted to the base via rails 12d. Further, by using a low heat conductivity material as the material for the connecting component 18b, the transfer of heat to the table 2 is suppressed. Because the heat transmitted to the table 2 is decreased, the temperature increase of the upper table 1 can be suppressed.

According to the present embodiment, the linear motor for driving the upper-level table is attached to the edge of the table 1, whereby the coil 20 and the table 2 can be moved integrally while being thermally insulated from each other.

While, in the present embodiment, the lower-level linear motor is disposed between the two rails 12d, it is also possible to use two linear motors and dispose them outside the two rails 12d so as to decrease the influence of a magnetic field change caused by the movement of the magnet.

DESCRIPTION OF SYMBOLS

1 Upper-level table
2 Lower-level table
3 Coil of upper-level table driving linear motor
4 Magnet of upper-level table driving linear motor
5 Coil of lower-level table driving linear motor
6 Magnet of lower-level table driving linear motor
7 Upper-level table connecting component
8 Heat-bypass component for upper-level table
9 Heat-bypass component for lower-level table
10 Lower-level table connecting component
11 Upper-level table rails
12 Lower-level table rails
13 Upper-level table slide unit
14 Lower-level table slide unit
15 Rolling elements in slide unit
16 Heat-bypassing slide unit
17 Heat-bypass component level with lower-level table
18 Component connecting lower-level table and heat-bypass component
19 Base
20 Coil of upper-level table driving linear motor
21 Magnet of upper-level table driving linear motor
22 Coil of lower-level table driving linear motor
23 Magnet of lower-level table driving linear motor

What is claimed is:

1. A stage apparatus comprising:
a table on which a sample is placed;
a drive source configured to drive the table in a predetermined direction;
a first connection member disposed between the table and the drive source;
a second connection member disposed closer to the drive source than the first connection member and disposed between the driving source and the first connection member so that the drive source is not in direct contact with the first connection member or the table, and the first connection member is movable with the table;
a slide unit supported by the second connection member or by a supported member supported by the second connection member, the slide unit being movable with the second connection member; and
a rail guiding the slide unit in the predetermined direction, wherein the first connection member comprises a relatively low heat conductivity member with respect to the second connection member.

2. The stage apparatus according to claim 1, wherein the drive source is a linear motor including a coil and a permanent magnet, wherein the coil is moved with the table.

3. The stage apparatus according to claim 1, wherein the stage apparatus comprises two, upper- and lower-levels of bi-axially movable stages,
wherein the lower-level stage is moved on a rail affixed to a stage base, and the upper-level stage is moved on a rail affixed to the table of the lower-level stage.

4. The stage apparatus according to claim 3, wherein the lower-level stage is provided with two rails in contact with the slide unit connected to the table, a linear motor disposed between the two rails, and a rail affixed to the base separately from the two rails,
wherein the third rail is in contact with a slide unit not contacting the lower-level table.

5. The stage apparatus according to claim 3, wherein the upper-level stage comprises two rails,
the apparatus further comprising a linear motor disposed outside the two rails.

6. The stage apparatus according to claim 1, wherein the first connection member comprises a resin material.

7. A charged particle beam apparatus comprising:
a charged particle source;
a sample stage configured to move a sample irradiated with a beam emitted from the charged particle source; and
a vacuum chamber in which the sample stage is installed, wherein the sample stage includes
a table on which the sample is placed;
a drive source configured to drive the table in a predetermined direction;
a first connection member disposed between the table and the drive source;
a second connection member disposed closer to the drive source than the first connection member and disposed between the driving source and the first connection member so that the drive source is not in direct contact with the first connection member or the table, and the first connection member is movable with the table;
a slide unit supported by the second connection member or by a supported member supported by the second connection member, the slide unit being movable with the second connection member; and
a rail guiding the slide unit in the predetermined direction, wherein the first connection member comprises a relatively low heat conductivity member with respect to the second connection member.

8. The stage apparatus according to claim 1, wherein the driving source, the second connection member, and the slide unit are arranged in that order to create a heat communication channel.

9. The charged particle beam apparatus according to claim 7, wherein the driving source, the second connection member, and the slide unit are arranged in that order to create a heat communication channel.

* * * * *